US012380929B2

(12) United States Patent
Yoshida et al.

(10) Patent No.: US 12,380,929 B2
(45) Date of Patent: *Aug. 5, 2025

(54) CENTRALIZED PLACEMENT OF COMMAND AND ADDRESS SIGNALS IN DEVICES AND SYSTEMS

(71) Applicant: Lodestar Licensing Group, LLC, Evanston, IL (US)

(72) Inventors: Kazuhiro Yoshida, Tokyo (JP); Kumiko Ishii, Tokyo (JP)

(73) Assignee: Lodestar Licensing Group LLC, Evanston, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/365,771

(22) Filed: Aug. 4, 2023

(65) Prior Publication Data

US 2023/0377611 A1 Nov. 23, 2023

Related U.S. Application Data

(63) Continuation of application No. 17/448,278, filed on Sep. 21, 2021, now Pat. No. 11,727,962, which is a
(Continued)

(51) Int. Cl.
*G11C 5/02* (2006.01)
*G11C 5/04* (2006.01)
(Continued)

(52) U.S. Cl.
CPC .............. *G11C 5/025* (2013.01); *G11C 5/04* (2013.01); *G11C 5/063* (2013.01); *G11C 7/1084* (2013.01);
(Continued)

(58) Field of Classification Search
CPC ........... G11C 5/025; G11C 8/18; G11C 7/109; G11C 5/04; G11C 7/225; G11C 7/1084; G11C 5/063; G11C 7/1087
See application file for complete search history.

(56) References Cited

U.S. PATENT DOCUMENTS 5,539,696 A 7/1996 Patel
5,790,839 A 8/1998 Luk et al.
(Continued)

FOREIGN PATENT DOCUMENTS

CN 1499378 A 5/2004
CN 102473148 A 5/2012
(Continued)

OTHER PUBLICATIONS

Chinese First Office Action and Search Report for Chinese Application No. 202080016042.8 dated Apr. 1, 2022, 5 pages.
(Continued)

*Primary Examiner* — Son T Dinh
*Assistant Examiner* — Elizabeth Rose Agger
(74) *Attorney, Agent, or Firm* — TraskBritt

(57) ABSTRACT

Devices are disclosed. A device may include a command and address (CA) interface including a first pair of input circuits arranged in a first direction. The CA interface further including at least one additional pair of input circuits arranged in a second direction relative to the first pair of input circuits. Associated systems are also disclosed.

20 Claims, 12 Drawing Sheets

Related U.S. Application Data continuation of application No. 17/028,558, filed on Sep. 22, 2020, now Pat. No. 11,164,608, which is a continuation of application No. 16/365,168, filed on Mar. 26, 2019, now Pat. No. 10,811,057.

(51) Int. Cl.
   *G11C 5/06* (2006.01)
   *G11C 7/10* (2006.01)
   *G11C 7/22* (2006.01)
   *G11C 8/18* (2006.01)

(52) U.S. Cl.
   CPC ............ *G11C 7/1087* (2013.01); *G11C 7/109* (2013.01); *G11C 7/225* (2013.01); *G11C 8/18* (2013.01)

(56) References Cited

U.S. PATENT DOCUMENTS

| | | | |
|---|---|---|---|
| 5,805,603 | A | 9/1998 | Araki et al. |
| 5,812,490 | A | 9/1998 | Tsukude |
| 6,172,935 | B1 | 1/2001 | Wright et al. |
| 6,636,110 | B1 | 10/2003 | Ooishi et al. |
| 6,937,494 | B2 | 8/2005 | Funaba et al. |
| 7,646,654 | B2 | 1/2010 | Merritt et al. |
| 8,116,114 | B2 | 2/2012 | Kobayashi et al. |
| 9,117,496 | B2 | 8/2015 | Shaeffer et al. |
| 9,343,506 | B2 | 5/2016 | Pellizzer |
| 10,115,709 | B1 | 10/2018 | Sasaki et al. |
| 10,147,712 | B1 | 12/2018 | Lendvay |
| 10,811,059 | B1 | 10/2020 | Hamada et al. |
| 2002/0110041 | A1 | 8/2002 | Kono |
| 2004/0105292 | A1 | 6/2004 | Matsui |
| 2006/0129712 | A1* | 6/2006 | Raghuram ............... G11C 5/04 710/52 |
| 2006/0245267 | A1 | 11/2006 | Choi |
| 2006/0259666 | A1 | 11/2006 | Lee |
| 2007/0291557 | A1 | 12/2007 | Nishio et al. |
| 2008/0304340 | A1 | 12/2008 | Kyung et al. |
| 2009/0161475 | A1* | 6/2009 | Kim .................... H03L 7/0816 365/233.1 |
| 2010/0046266 | A1 | 2/2010 | Bruennert et al. |
| 2010/0115172 | A1 | 5/2010 | Gillingham et al. |
| 2012/0117338 | A1 | 5/2012 | Vaidyanath et al. |
| 2013/0033935 | A1 | 2/2013 | Tu et al. |
| 2013/0162308 | A1 | 6/2013 | Sakashita et al. |
| 2014/0082260 | A1 | 3/2014 | Oh et al. |
| 2014/0117424 | A1 | 5/2014 | Kim |
| 2015/0348905 | A1 | 12/2015 | Tsai et al. |
| 2016/0012865 | A1 | 1/2016 | Lee et al. |
| 2016/0181214 | A1 | 6/2016 | Oh et al. |
| 2016/0196878 | A1 | 7/2016 | Kim et al. |
| 2016/0240471 | A1 | 8/2016 | Klowak et al. |
| 2016/0293227 | A1 | 10/2016 | Chi |
| 2017/0038428 | A1 | 2/2017 | Jung et al. |
| 2017/0053690 | A1 | 2/2017 | Kim et al. |
| 2017/0077276 | A1 | 3/2017 | Suzuki et al. |
| 2017/0255404 | A1 | 9/2017 | Vergis et al. |
| 2017/0323875 | A1 | 11/2017 | Tam |
| 2017/0329535 | A1 | 11/2017 | Jeon |
| 2017/0338175 | A1 | 11/2017 | Liu et al. |
| 2018/0019007 | A1 | 1/2018 | Lee et al. |
| 2018/0090185 | A1 | 3/2018 | Hossain et al. |
| 2018/0130739 | A1 | 5/2018 | Miura et al. |
| 2018/0218762 | A1 | 8/2018 | Matsui |
| 2019/0066745 | A1* | 2/2019 | Wilmoth |
| 2019/0081623 | A1 | 3/2019 | Mizan et al. |
| 2020/0083252 | A1* | 3/2020 | Sobue |
| 2021/0202468 | A1* | 7/2021 | Matsui |

FOREIGN PATENT DOCUMENTS

| | | |
|---|---|---|
| CN | 105122227 B | 10/2018 |
| JP | 2017-174994 A | 9/2017 |
| KR | 10-2019-0017266 A | 2/2019 |

OTHER PUBLICATIONS

European Search Report and Opinion for Application No. 20779879.4 dated Oct. 10, 2022, 8 pages.
International Search Report for Application No. PCT/US2020/017259, mailed Jun. 9, 2020, 7 pages.
Written Opinion of the International Searching Authority for Application No. PCT/US2020/017259, ,mailed Jun. 9, 2020, 6 pages.
Korean Notice of Reasons for Rejection for Korean Application No. 10-2021-7033486, dated Oct. 26, 2023, 16 pages with English translation.
Korean Decision of Rejection for Korean Application No. 10-2021-7033486, dated Apr. 26, 2024, 7 pages with English translation.

* cited by examiner

CENTRALIZED PLACEMENT OF COMMAND AND ADDRESS SIGNALS IN DEVICES AND SYSTEMS

CROSS-REFERENCE TO RELATED APPLICATIONS

This application is a continuation of U.S. patent application Ser. No. 17/448,278, filed Sep. 21, 2021, now U.S. Pat. No. 11,727,962, issued Aug. 15, 2023, which is a continuation of U.S. patent application Ser. No. 17/028,558, filed Sep. 22, 2020, now U.S. Pat. No. 11,164,608, issued Nov. 2, 2021, which is a continuation of U.S. patent application Ser. No. 16/365,168, filed Mar. 26, 2019, and titled "CENTRALIZED PLACEMENT OF COMMAND AND ADDRESS IN MEMORY DEVICES," now U.S. Pat. No. 10,811,057, issued Oct. 20, 2020, which application is related to U.S. patent application Ser. No. 16/365,218, filed Mar. 26, 2019, and titled "CENTRALIZED PLACEMENT OF COMMAND AND ADDRESS SWAPPING IN MEMORY DEVICES," now U.S. Pat. No. 10,978,117, issued Apr. 13, 2021, the disclosure of each of which is hereby incorporated herein in its entirety by this reference.

TECHNICAL FIELD

Embodiments of the disclosure relate to placement of circuitry in memory devices, and more specifically, to placement of circuitry for command and address signals in memory devices.

BACKGROUND

Memory devices are typically provided as internal, semiconductor, integrated circuits in many computers and other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Electronic systems, such as memory systems, often include one or more types of memory, and that memory is typically coupled to one or more communications channels within a memory system. Time varying signals in such systems are utilized to transfer information (e.g., data) over one or more conductors often referred to as signal lines. These signal lines are often bundled together to form a communications bus, such as an address or data bus.

Memory systems often operate in portable devices with limited power supplied by batteries or other energy storage devices. In these low-power systems, and in general for most memory systems, there is a persistent demand for higher operating performance and at lower power. As a result, designers continue to strive for increasing operating speeds and ways to reduce power within memory systems and on memory devices.

Power consumption in many semiconductor devices is generally related to signal load and signal frequency in a relationship where power for digital signals can be considered proportional to $CV^2F$; where C is a capacitive load on a signal, V is a voltage range the signal switches through, and F is an average frequency at which the signal switches. There is a continuing need to reduce power consumed by memory devices by addressing various design elements of a memory device, which may include circuit design, logic design, and layout considerations.

DETAILED DESCRIPTION

Figure 1:
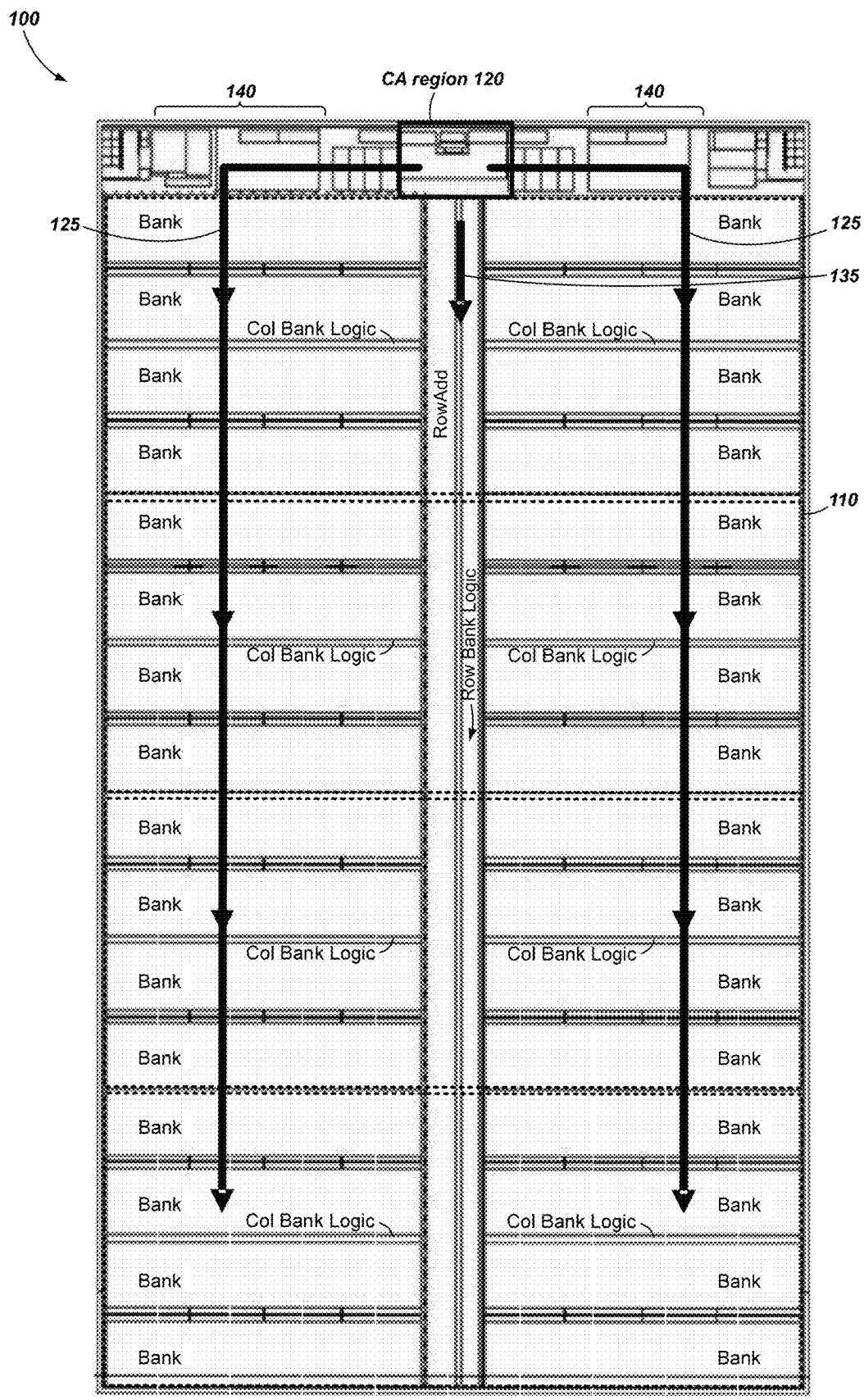
FIG. 1 is a layout diagram of a memory device.

In the following detailed description, reference is made to the accompanying drawings, which form a part hereof, and in which are shown, by way of illustration, specific example embodiments in which the present disclosure may be practiced. These embodiments are described in sufficient detail to enable a person of ordinary skill in the art to practice the present disclosure. However, other embodiments may be utilized, and structural, material, and process changes may be made without departing from the scope of the disclosure. The illustrations presented herein are not meant to be actual views of any particular method, system, device, or structure, but are merely idealized representations that are employed to describe the embodiments of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

Reference throughout this specification to "one embodiment," "an embodiment," or similar language means that a particular feature, structure, or characteristic described in connection with the indicated embodiment is included in at least one embodiment of the present disclosure. Thus, the phrases "in one embodiment," "in an embodiment," and similar language throughout this specification may, but do not necessarily, all refer to the same embodiment.

As used herein, spatially relative terms, such as "beneath," "below," "lower," "bottom," "above," "upper," "top," "front," "rear," "left," "right," and the like, may be used for ease of description to describe one element or feature's relationship to another element(s) or feature(s) as illustrated in the figures. Unless otherwise specified, the spatially relative terms are intended to encompass different orientations of the device in use or operation in addition to the orientation depicted in the figures. For example, if a device in the figures is turned over, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The device may be otherwise oriented (rotated 90 degrees or at other orientations) and the spatially relative descriptors used herein interpreted accordingly. In addition, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal.

As used herein, the singular forms "a," "an," and "the" are intended to include the plural forms as well, unless the context clearly indicates otherwise. In addition, it should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

As used herein, "and/or" includes any and all combinations in the inclusive and alternate forms of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

Elements described herein may include multiple instances of the same element. These elements may be generically indicated by a numerical designator (e.g., 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

Headings may be included herein to aid in locating certain sections of detailed description. These headings should not be considered to limit the scope of the concepts described under any specific heading. Furthermore, concepts described in any specific heading are generally applicable in other sections throughout the entire specification.

Although various embodiments discussed herein use examples relating to a single-bit memory storage concept for ease in understanding, the inventive subject matter can be applied to numerous multiple-bit schemes as well. For example, each of the memory cells can be programmed to a different one of at least two data states to represent, for example, a value of a fractional bit, the value of a single bit or the value of multiple bits such as two, three, four, or more numbers of bits. For example, memory cells can be programmed to one of two data states to represent a binary value of "0" or "1" in a single bit. Such a cell is sometimes called a single-level cell (SLC). A cell that can be programmed to one of more than two data states is sometimes referred to as a multi-level cell (MLC).

Centralized Placement

As used herein the terms "centralized" and "centralized region" mean that elements and/or circuits are configured to be gathered together such that the elements are neighboring in a relatively compact region. For example, command and address (CA) input circuits for embodiments of the present disclosure are gathered together such that the elements are neighboring in a relatively compact region. This centralized arrangement is as opposed to a localized arrangement where elements and circuits are distributed such that they are placed local to elements they are associated with. For example, in conventional memory device arrangements the CA input circuits may be generally localized so they are placed near the bonding pad they are associated with, which causes the CA input circuits to be distributed across a large region of a memory device. Unless specifically stated herein, "centralized" and "centralized region" does not mean a specific location on a memory device. For example, a centralized region does not mean the region is placed in a center location of a memory device or place in a central location relative to an edge of the memory device.

Embodiments of the present disclosure reduce power of a memory device by placing CA input circuits in a centralized CA interface region. This centralized placement keeps the CA input circuits in a relatively compact region, which enables compact routing of clock signals, as well as other signals. The compact routing reduces capacitance associated with routing and thus reduces power consumption because a large element of power consumption for digital signals can be considered proportional to $CV^2F$; where C is a capacitive load on a signal, V is a voltage range the signal switches through, and F is an average frequency at which the signal switches.

In conventional memory devices, the CA input circuits may be localized near their associated bonding pads. As a result, clock signals for the CA input circuits have to travel a relatively long distance, increasing the capacitive load on the clock signals, which increases power consumption for the clock signals. In addition, with the CA input circuits distributed, buffer sizes for the input buffers need to be larger, and consume more power to drive the longer distance and thus more capacitance, for the signals to arrive at their destination elsewhere on the memory device.

FIG. 1 is a layout diagram of a memory device 100. The memory device is configured in a layout arrangement that includes a memory cell region 110, a CA region 120, and one or more data buffer regions 140, among other regions. The memory cell region 110 may be arranged in banks such as shown in FIG. 1. A row address bus 135 and row bank logic may be positioned between the upper and lower portions of the memory cell region 110. Column address busses 125 may be positioned throughout the upper and lower portions of the memory cell region 110. While shown as a single bus for clarity, these column addresses may be distributed at various locations within the memory cell banks in an efficient layout for addressing the various memory cells. Bonding pads may be arranged along the left side of the memory device 100.

The data buffer regions 140 may be position near bonding pads for one or more data input/output signals along an edge of the memory device 100.

The CA region 120 may be placed between the bonding pad region and the memory cell region 110. The CA region 120 is configured to buffer and latch CA input signals as explained below.

Of course, FIG. 1 is an example layout configuration used as an example to provide detail for embodiments of the present disclosure. Many other layout, circuit, logical, and functional partitioning situations are possible and embodiments of the present disclosure can be practiced with these other situations.

Figure 2:
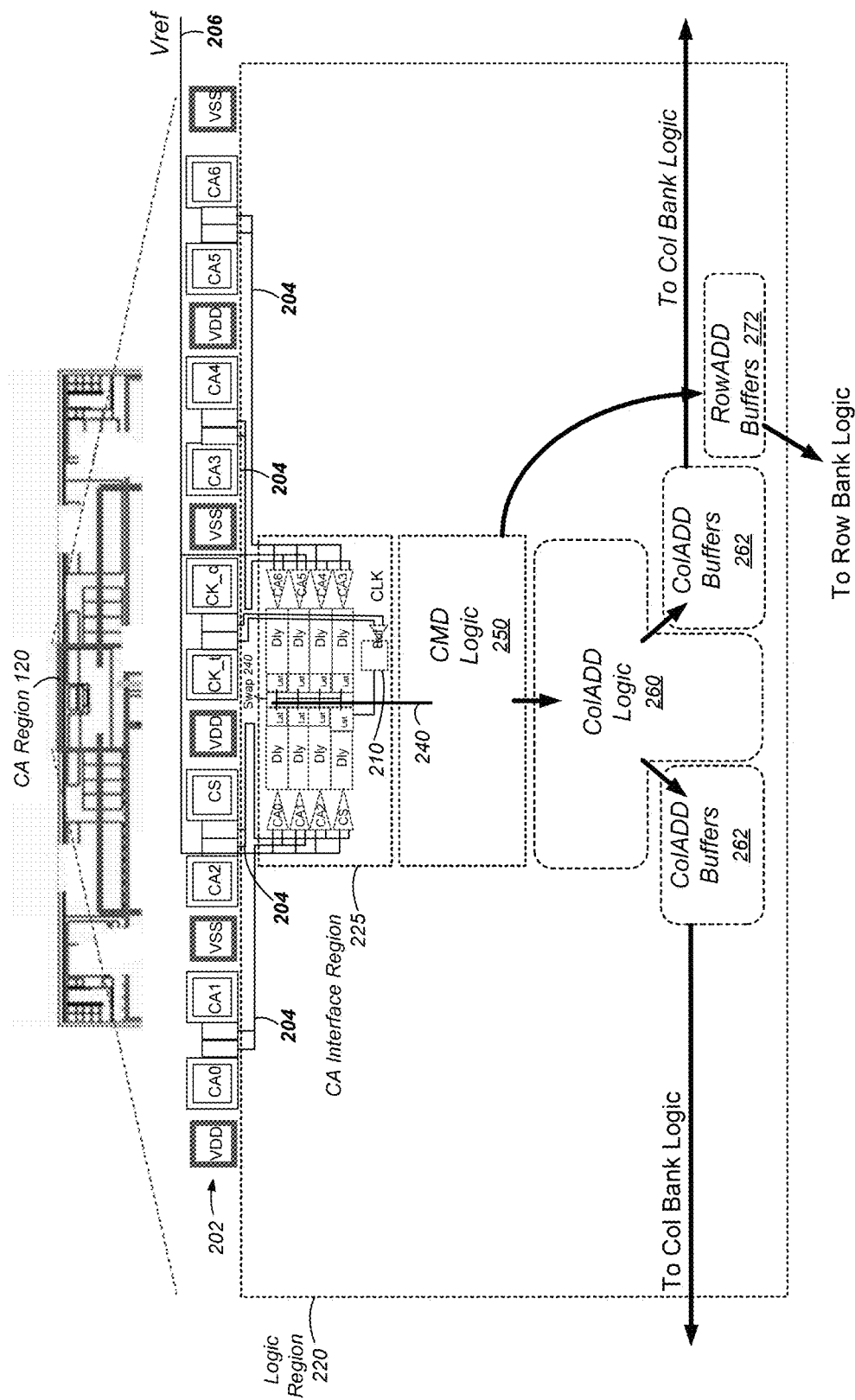
FIG. 2 is a layout diagram showing details of a centralized command and address (CA) interface region.

FIG. 2 is a layout diagram showing details of the CA region 120. At the top of FIG. 2, a small portion of the memory device 100 from FIG. 1 is shown rotated clockwise 90 degrees such that it shows an edge of the memory device 100 where the CA region 120 is positioned. The lower portion of FIG. 2 shows an expanded view of the CA region 120. The CA region 120 includes bonding pads 202 for bonding to external CA input signals. Bonding pads are also shown for power signals such as VSS and VDD. CA input signals 204 are routed from the bonding pads to a centralized CA interface region 225.

Within the centralized CA interface region 225 are eight CA input circuits, one for each of input signals CA0-CA6 and one for a chip select input signal (CS). Each of the CA input signals 204 couple with a buffer, which may be configured to buffer and determine logic levels of the CA input signals 204 relative to a voltage reference 206. The CA input circuits generate internal CA signals (e.g., for CA0-CA6 in this example). Additional details for the CA input circuits are discussed below when discussing details of FIGS. 3 and 4.

A clock buffer circuit 210 buffers one or more clock input signals (e.g., CK_t, CK_c) from the bonding pads. A clock signal from the clock buffer may be fed through the CS input circuit where it may be gated with the CS input signal such that a clock output of the CS input circuit follows the clock input signal when the CS input signal is asserted and holds the clock output level at a high or low voltage when the CS input signal is negated. The clock output feeds each of the CA input circuits and may feed other circuitry in logic region 220. Keeping clock signals short helps embodiments of the present disclosure reduce power consumption. As a result, placement of the clock buffer circuit 210 near the CA input circuits and also near other circuitry in the logic region 220 can help to reduce clock signal routing length.

The internal CA signals 240 feed circuitry for command logic decode 250. The internal CA signals 240 may carry different information depending on state of the memory device 100 and timing on the CA input signals 204. For example, the internal CA signals 240 may be decoded to various commands for the memory device 100. At other times, the internal CA signals 240 may be decoded to row address information or column address information. Moreover, in some contexts, address information may be included on the internal CA signals 240 at the same time as command information. Circuitry for column address logic 260 may determine which column addresses should be driven by column address buffers 262 to the column bank logic shown in FIG. 1. Similarly, the command logic decode 250 may determine which row addresses should be driven by row address buffers 272 to the row bank logic shown in FIG. 1. In addition, the command logic decode 250 may determine, or assist in determining operations and timing for operations of the memory device 100 such as reads, writes, and refreshes.

Figure 3:
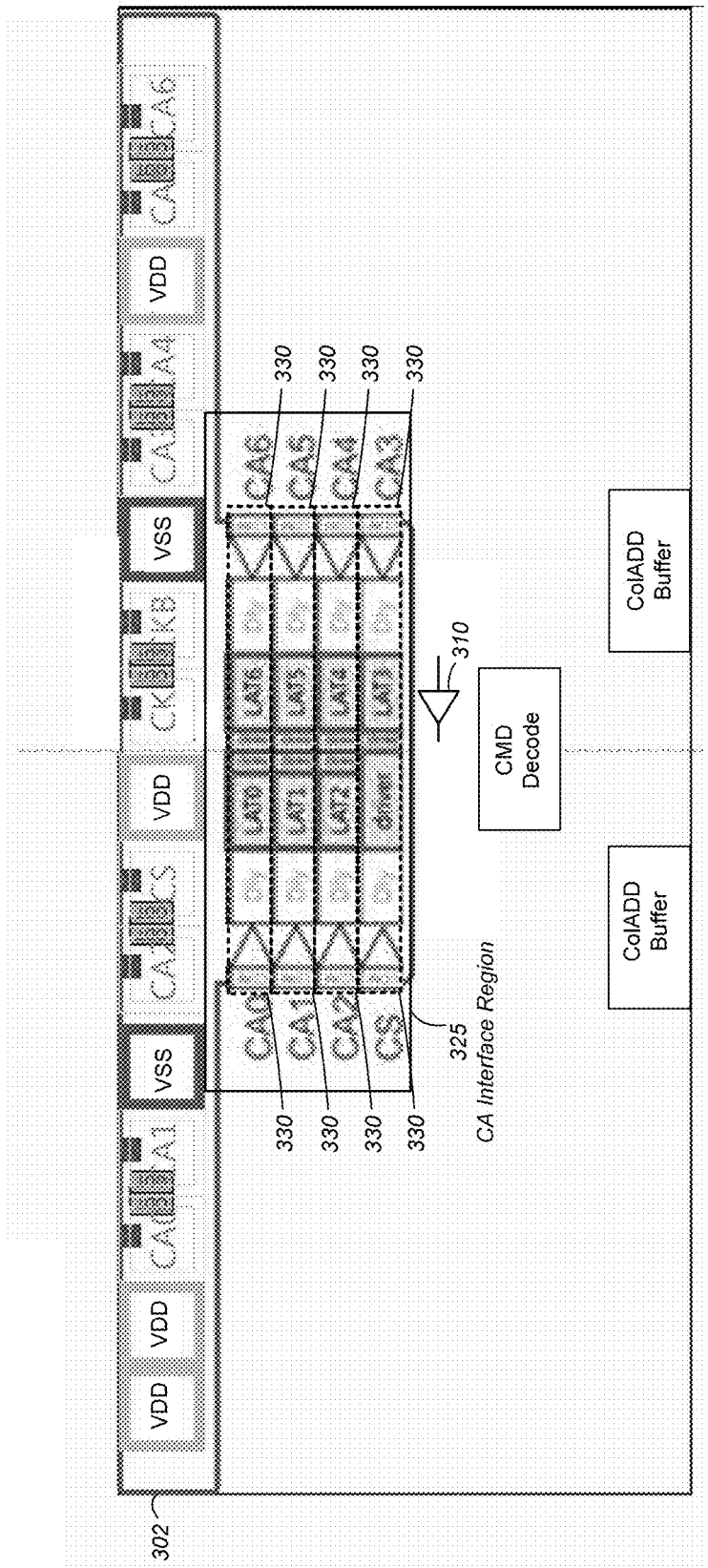
FIG. 3 is a layout diagram showing details of the CA interface region according to another embodiment.

FIG. 3 is a layout diagram showing details of the centralized CA interface region 325 according to another embodiment. In this figure, details of the centralized CA interface region 325 can be seen below a bonding pad region 302. FIG. 3 also shows the command logic decode region and the column address buffers, similar to those illustrated in FIG. 2.

Figure 4:
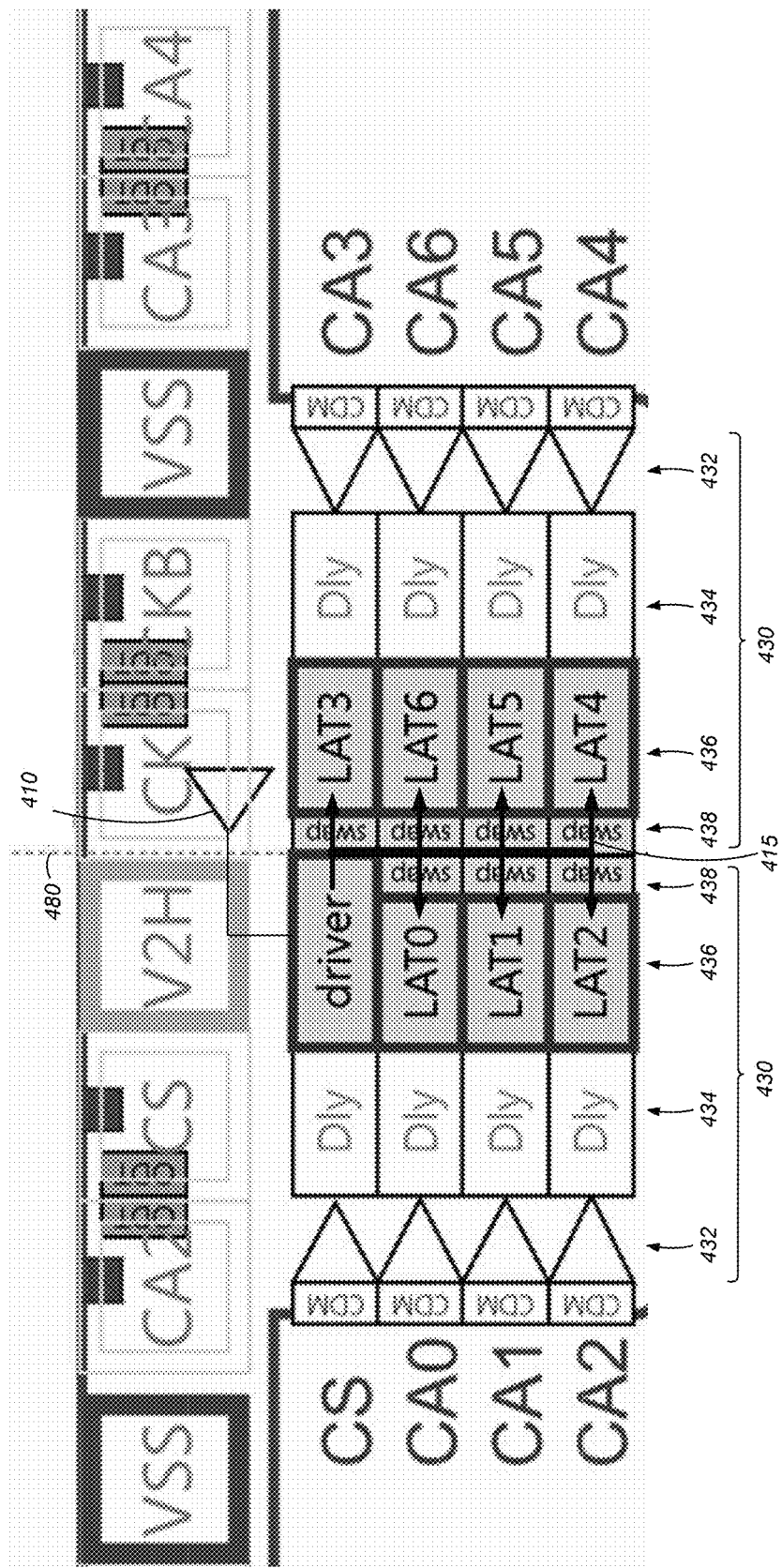
FIG. 4 is a layout diagram showing details of the CA interface region and a clock signal.

FIG. 4 is a layout diagram showing details of the centralized CA interface region 325 and a clock signal 415 according to another embodiment.

Referring to both FIGS. 3 and 4, on die termination (ODT) may be included near the bond pads in the bond pad region for each of the CA input signals. The wiring from the ODT to the CA input circuits 330 may be relatively long, however, the signals at this point of this wiring may be driven from an external memory controller. As a result, power for driving these longer signals comes from the memory controller, rather than power consumed by the memory device 100 while still keeping the input signals within load specifications for the memory device 100.

Working inward toward a symmetry line 480, each CA input circuit 330 for CA0-CA6 may be configured to include an input buffer circuit 432, a delay circuit 434, a latch circuit 436, and a swap circuit 438. Thus, these CA input circuits 330 may be placed as pairs of CA input circuits 330 in a mirror relationship in a first direction (e.g., left to right) and the pairs of CA input circuits 330 may be stacked in a second direction (e.g., top to bottom). In such an arrangement, a first CA pair includes CA input circuits 330 for CA0 and CA6, a second CA pair includes CA input circuits 330 for CA1 and CA5, a third CA pair includes CA input circuits 330 for CA2 and CA4. Finally, a fourth CA pair includes a CA input circuit 330 for CA3 and a CA input circuit 330 for CS. Note that the CA input circuit 330 for CS may be configured somewhat differently because the chip select signal does not need a latch circuit 436 and may need a larger driver to drive the clock signals 415. Stated another way, this arrangement of the CA input circuits 330 may be placed in a two-by-four matrix.

The layouts of FIGS. 3 and 4 do not illustrate wiring between the bonding pads and the input buffers. However, an example of such wiring can be seen in FIG. 2. In all of FIGS. 2-4, the input signals (e.g., 204 in FIG. 2) may include wiring lengths such that the length from the bonding pads to the corresponding CA input circuits 330 are substantially the same length for each signal. The substantially equal length wires ensure that the delay times and input capacitances are substantially matched. Thus, for the signals (e.g., CA0, CA1, CA5, and CA6) with bonding pads far from the CA interface region 225, the wires between the bonding pads may be as direct as possible. On the other hand, for the signals (e.g., CA2, CA3, and CA4) with bonding pads relatively close to the CA interface region 225, the wires between the bonding pads may take a meandering path such that the wire lengths more closely match the wire length for the other signals.

As stated earlier, the input buffer circuit 432 may be configured to compare the input signals to a voltage reference to determine a logic level of the input signals.

The delay circuit 434 may be included between the input buffer circuit 432 and the latch circuit 436. The delay circuit may be used to adjust signal timing of the CA input signals relative to the clock signal 415 to manage setup and hold times for the latch circuit 436.

The latch circuit 436 may be used to capture a state of the CA input signals at a specific time relative to the clock signal 415. While described as a latch, in various embodiments the latch circuit 436 may be configured as a latch, a flip-flop, or other state holding circuitry configured to capture a state of the input signal relative to the clock signals 415 and hold the captured state on an output signal. The output from the latch circuit 436 feeds a swap circuit 438. Details of the swap circuit are discussed below with reference to FIGS. 7-10.

As can be seen from the clock routing of the clock signals 415, the length of routing needed for the clock signal is drastically reduced when compared to a layout where circuitry associated with the CA input signals may have a localized positioning near the associated bond pad. Moreover, the layout arrangement with the CA input circuits 330 mirrored and neighboring each other enables not only a short layout, but a tree structure that closely aligns the clock timing to each of the latches.

The embodiments of FIGS. 2, 3, and 4 have small differences in placement of the CA input circuits 330 and the clock buffer circuit (210, 310, 410, respectively).

In FIGS. 2 and 3, the clock buffer circuit (210, 310) is placed below the CA input circuits 330 and near the CA input circuit 330 for the CS input, which is placed on the bottom of the two-by-four matrix. This placement makes routing from the bond pads to the clock buffer circuit 210 longer, while clock signal routing between the clock buffer circuit 310 and the CA input circuit 330 for the CS input is relatively short.

In FIG. 4, the clock buffer circuit 410 is placed above the CA input circuits 330 but near the CA input circuit 330 for the CS input, which is placed on the top of the two-by-four matrix. This placement makes routing from the bond pads to the clock buffer circuit 310 shorter and clock signal routing between the clock buffer circuit 310 and the CA input circuit 330 for the CS input short.

All of the embodiments shown in FIGS. 2-4 drastically reduce the length of clock routing after the CS input buffer, which generates the clock signals 415 to the CA input circuits 330, because the CS input buffer is placed near the other CA input circuits 330.

Figure 5:
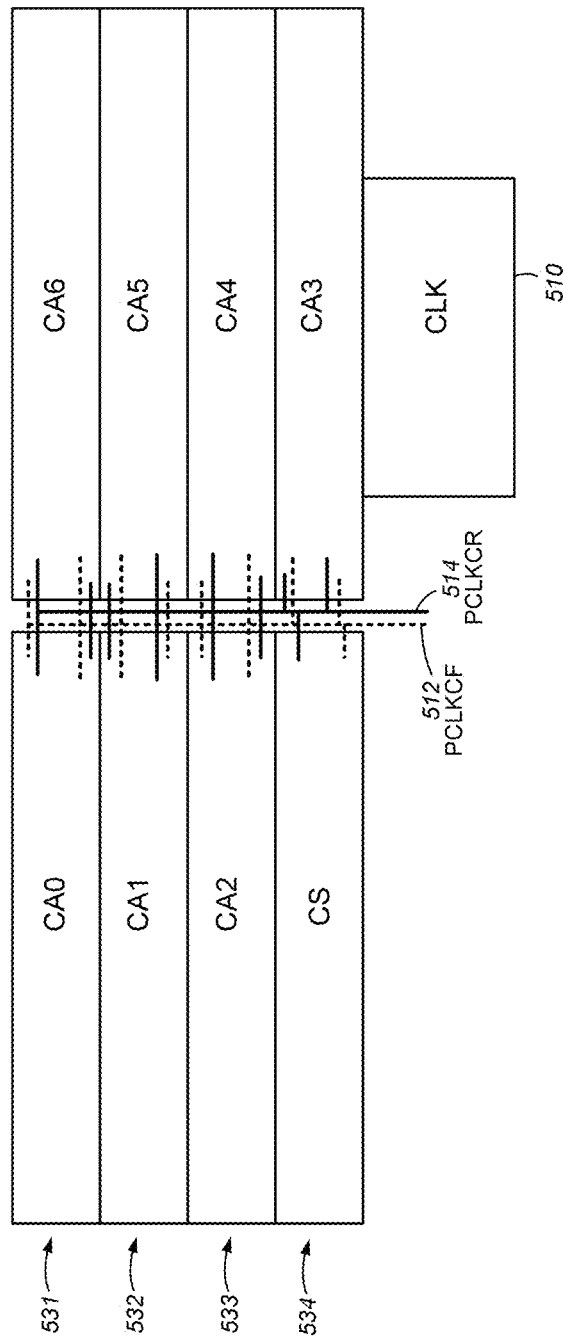
FIG. 5 is a detailed layout diagram illustrating a configuration of the CA interface region.

FIG. 5 is a detailed layout diagram illustrating a configuration of the CA interface region. In a similar fashion to the embodiment of FIG. 2, the CA input circuits 330 are arranged in a first pair of CA input circuits 531 (CA0 and CA6), a second pair of CA input circuits 532 (CA1 and CA5), a third pair of CA input circuits 533 (CA2 and CA4), and an additional pair of CA input circuits 534 for CA3 and the CS signal. The clock buffer circuit 510 is placed below the arrangement of the CA input circuits 330. Also shown in FIG. 5 is actual clock routing for a rising version of the clock 514 (PCLKCR) and an opposite falling version of the clock 512 (PCLKCF).

Figure 6:
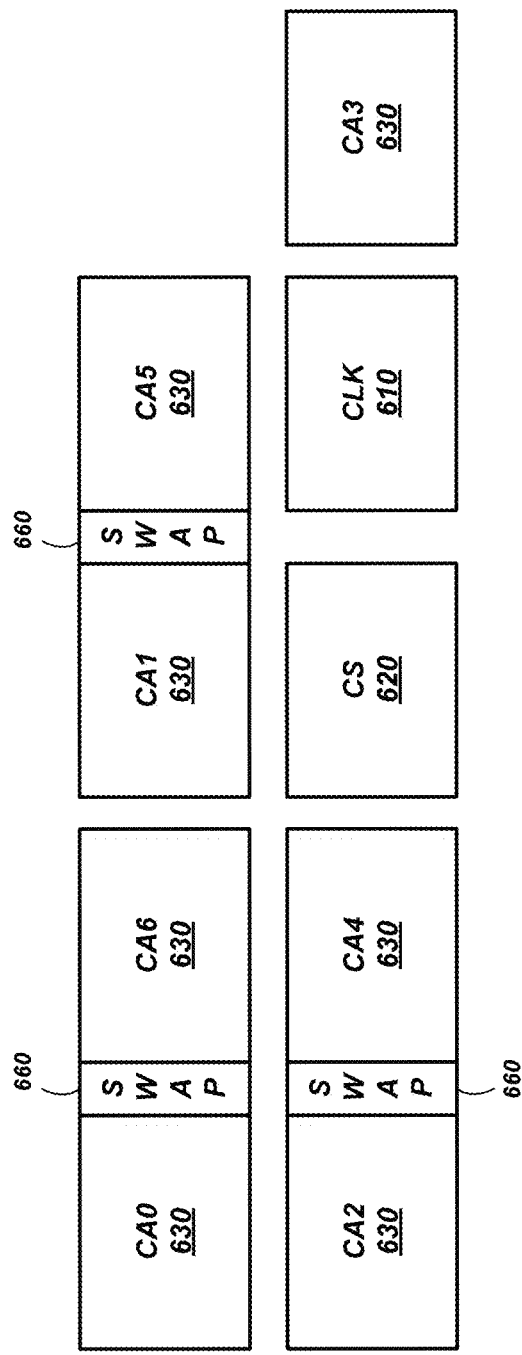
FIG. 6 is a simplified layout diagram illustrating an alternate configuration of CA input circuits for the CA interface region.

FIG. 6 is a simplified layout diagram illustrating an alternate configuration of CA input circuits 630 for the centralized CA interface region 325. In the embodiments of FIGS. 2-5 three pairs of CA input circuits 330 are arranged side-by-side in pairs and the pairs are stacked in an up and down direction. In the embodiment of FIG. 6, a first pair (CA0-CA6) is placed in the upper left, a second pair (CA2-CA4) is placed below the first pair, and a third pair (CA1-CA5) is placed to the upper right. These pairs are formed for swapping purposes as explained below and thus include a swap circuit 660. In this swapping configuration CA3 does not have another CA signal to swap with so its CA input circuit 630 can be placed on its own, but neighboring the other CA input circuits 630 for short clock routing. Similarly, CS does not swap so its CA input circuit 630 can be placed on its own, but neighboring the other CA input circuits 330. The clock buffer 610 may be placed near the CS input circuit 620 depending on routing constraints or other desired parameters for the clock signal. Of course, the pairs could also be arranged in different locations.

FIGS. 2-6 are used as examples for the purpose of discussion, other centralized arrangements are possible for other embodiments of the present disclosure. In all of these layout arrangements of FIGS. 2-6, clock signal routing, as well as other signal routing is reduced because of the centralized layout where the CA input circuits 330 closely neighbor each other, border each other, or even abut with each other. Selection of various arrangements and embodiments of the present disclosure would depend on layout constraint such as, for example, aspect ratio available, metal layers available, routing capacitance, etc.

Signal Swapping with Centralized Placement

Figure 7:
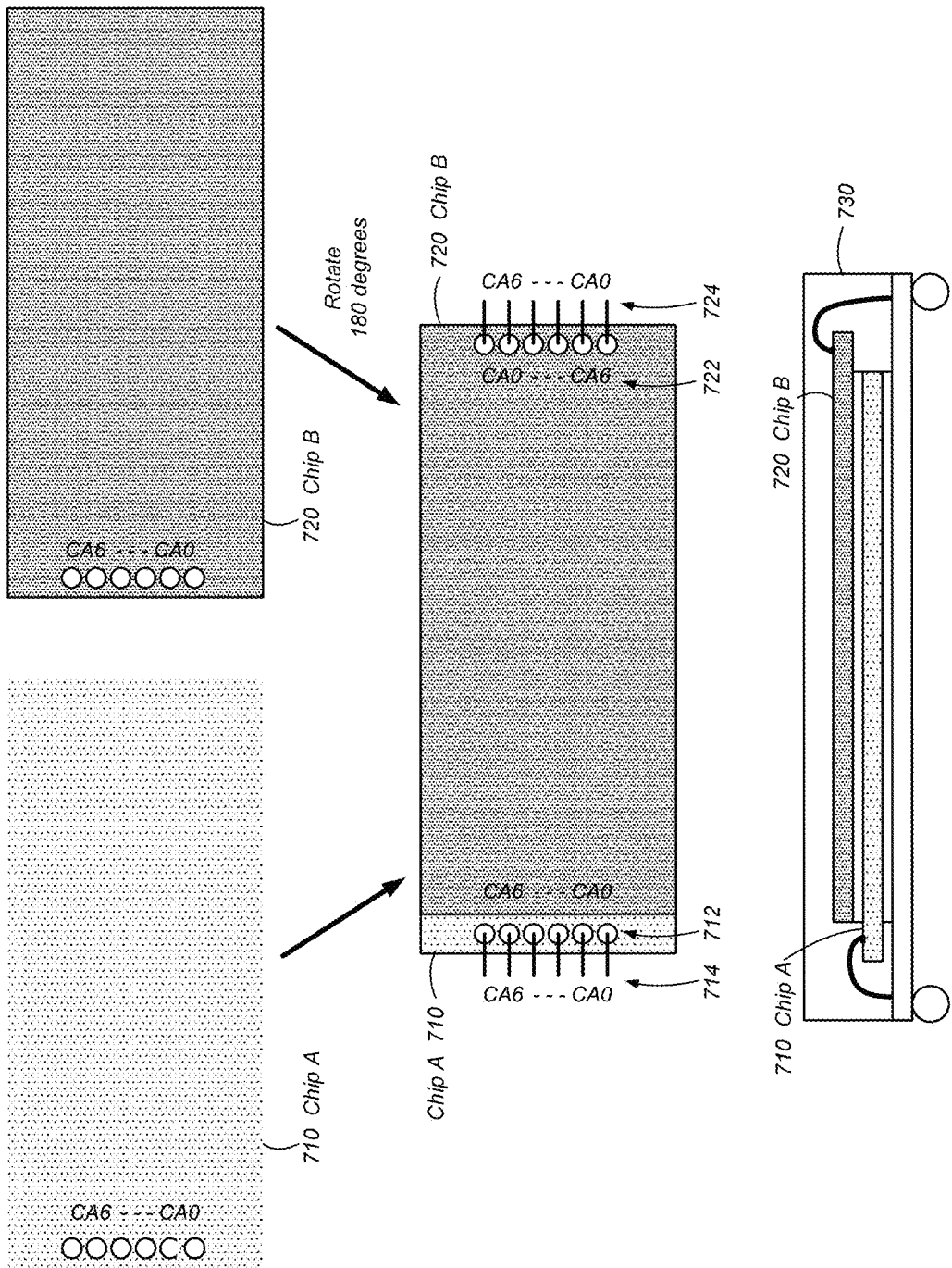
FIG. 7 illustrates stacking of two memory devices with one of the memory devices rotated 180 degrees.

FIG. 7 illustrates stacking of two memory devices with one of the memory devices rotated 180 degrees. In some packaging configurations two or more chips of the same type may be stacked on top of each other. Chip A 710 and chip B 720 are the same type of memory device and include bonding pads for CA inputs 0-6 on a left side of the memory device. In some embodiments, when stacked in a package 730, chip B 720 may be rotated 180 degrees when placed on top of (or below) chip A 710.

In this arrangement, packaged external signals 714 for chip A 710 go from a bottom-to-top order of CA0 to CA6. Similarly, external signals 724 for chip B 720 go from the bottom-to-top order of CA0 to CA6. For chip A 710, on-device bonding pads 712 go from the bottom-to-top order of CA0 to CA6 so they match up in the same order with the external signals 714. However, for chip B 720, the on-device bonding pads 722 now go from the bottom-to-top order of CA6 to CA0 because chip B 720 was rotated 180 degrees. In other words, the on-device bonding pads 722 for chip B are now in an opposite order from the external signals 724. Embodiments of the present disclosure provide a swapping mechanism for these CA signals while in the centralized layout configurations discussed above. The swap circuits are shown in FIGS. 2-4 and 6 as positioned between mirrored pairs.

Figure 8:
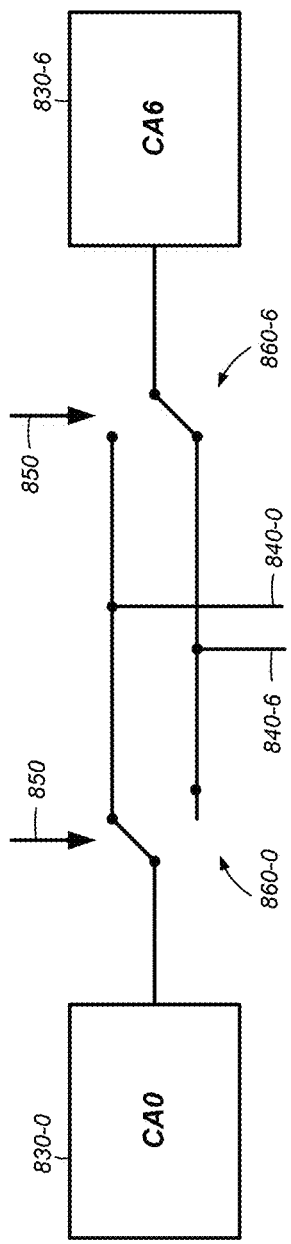
FIG. 8 illustrates a simplified circuit diagram for CA swapping.

FIG. 8 illustrates a simplified circuit diagram for the CA swapping. This example includes seven CA addresses on the memory device. As a result, for this example on one of the memory devices, CA0 and CA6 may need to be swapped, CA1 and CA5 may need to be swapped, and CA2 and CA4 may need to be swapped. Finally, CA3, being in the middle of an odd number of signals, does not need to be swapped. FIG. 8 uses CA0 and CA6 as an example rather than show all the pairs.

An input circuit for CA0 830-0 is coupled to a swap circuit 860-0. Similarly, an input circuit for CA6 860-6 is coupled to a swap circuit 860-6. A control signal 850 controls switching of the two swap circuits (860-0 and 860-6) in an opposite manner. As non-limiting examples, the control signal 850 may be coupled to a mode bit in a programmable mode register, be configured as a wiring option, be configured as a bonding option, or other suitable means of indicating that the memory device needs to swap the signals on the CA bus. Of course, similar swap circuits are included (but not shown) for the CA1-CA5 pair and the CA2-CA4 pair and a swap circuit is not needed for the CA3 signal.

In the swap circuit positions shown in FIG. 8 (may also be referred to as a first state or a negated state), the internal signal CA0 840-0 (also referred to herein as a first CA output) is coupled through the swap circuit 860-0 to the input circuit CA0 830-0. Similarly, the internal signal CA6 840-6 (also referred to herein as a second CA output) is coupled through the swap circuit 860-6 to the input circuit CA0 830-6. As a result, the internal signals follow the input circuit signals in the illustrated swap circuit positions.

When the swap circuit positions are opposite from that shown in FIG. 8 (may also be referred to as a second state or an asserted state), the internal signal CA0 840-0 is coupled through the swap circuit 860-6 to the input circuit CA6 830-6. Similarly, the internal signal CA6 840-6 is coupled through the swap circuit 860-0 to the input circuit CA0 830-0. As a result, the internal signals are swapped relative to the input circuit signals in the unillustrated swap circuit position.

The name and function for the state of the control signal 850 is arbitrary. For example, if the state is defined something like a normal state or pass-through state, asserted would mean to keep the signals aligned and negated would mean to swap the signals. On the other hand, if the state is defined something like a swap state, asserted would mean to swap the signals and negated would mean to keep the signals aligned.

The swap circuits may be configured with any suitable circuitry for selecting an output from one of two inputs in response to the state of the control signal 850. Non-limiting examples include two n-channel transistors in parallel, two p-channel transistors in parallel, two pass-gates in parallel, and a multiplexer.

Figure 9:
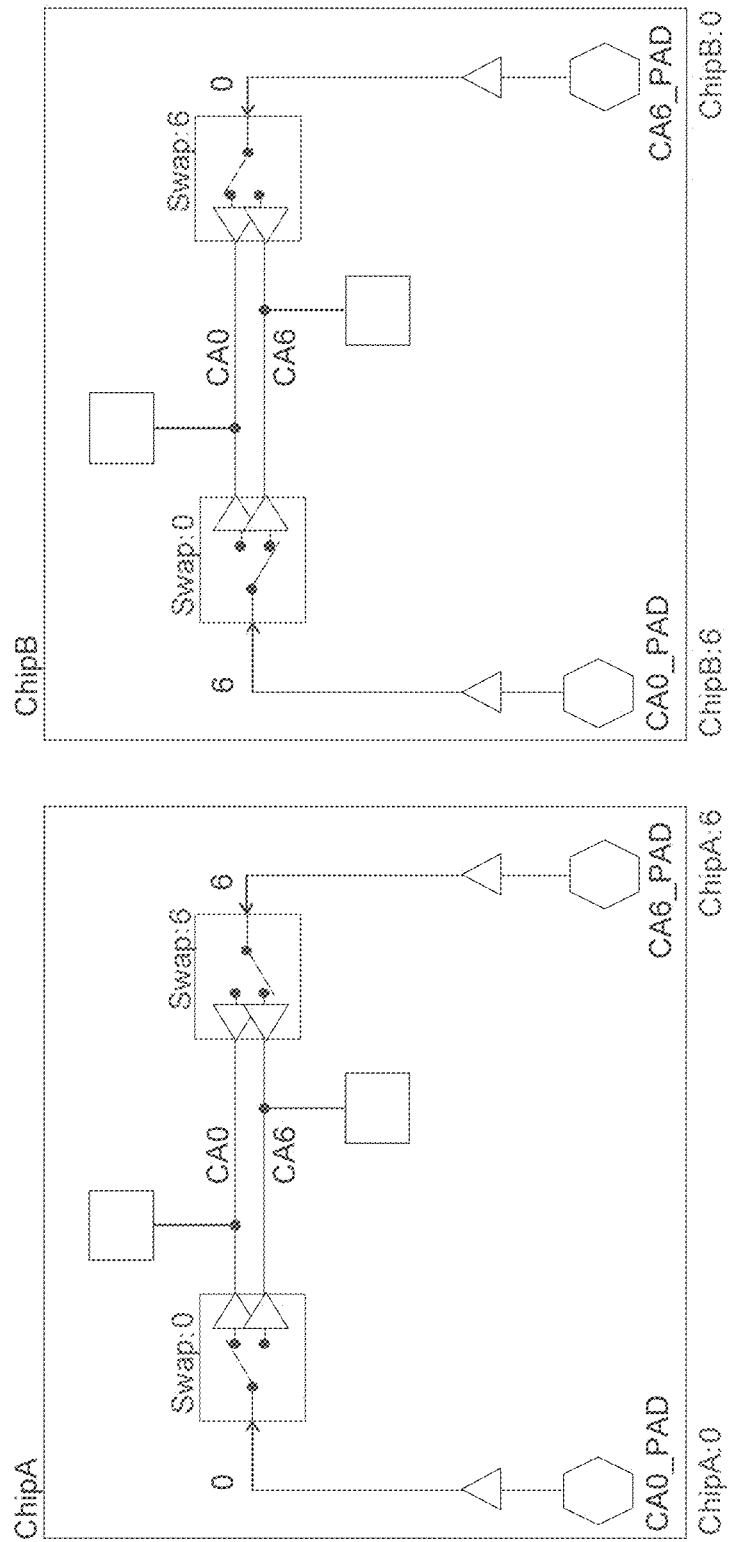
FIG. 9 illustrates a simplified circuit diagram for CA swapping from bond pads.

FIG. 9 illustrates a simplified circuit diagram for CA swapping from bond pads. This configuration is similar to that of FIG. 8 except FIG. 9 illustrates the two different swap circuit positions for the two different memory devices. Thus, for a CA pair on chip A, the internal CA0 signal is coupled through swap 0 to the CA0 pad and the internal CA6 signal is coupled through swap 6 to the CA6 pad. However, for a CA pair on chip B, the swap circuits are on the opposite configuration such that the internal CA0 signal is coupled through swap 6 to the CA6 pad and the internal CA6 signal is coupled through swap 0 to the CA0 pad. Again, similar swap circuits are included (but not shown) for the CA1-CA4 pair and the CA2-CA3 pair.

Figure 10:
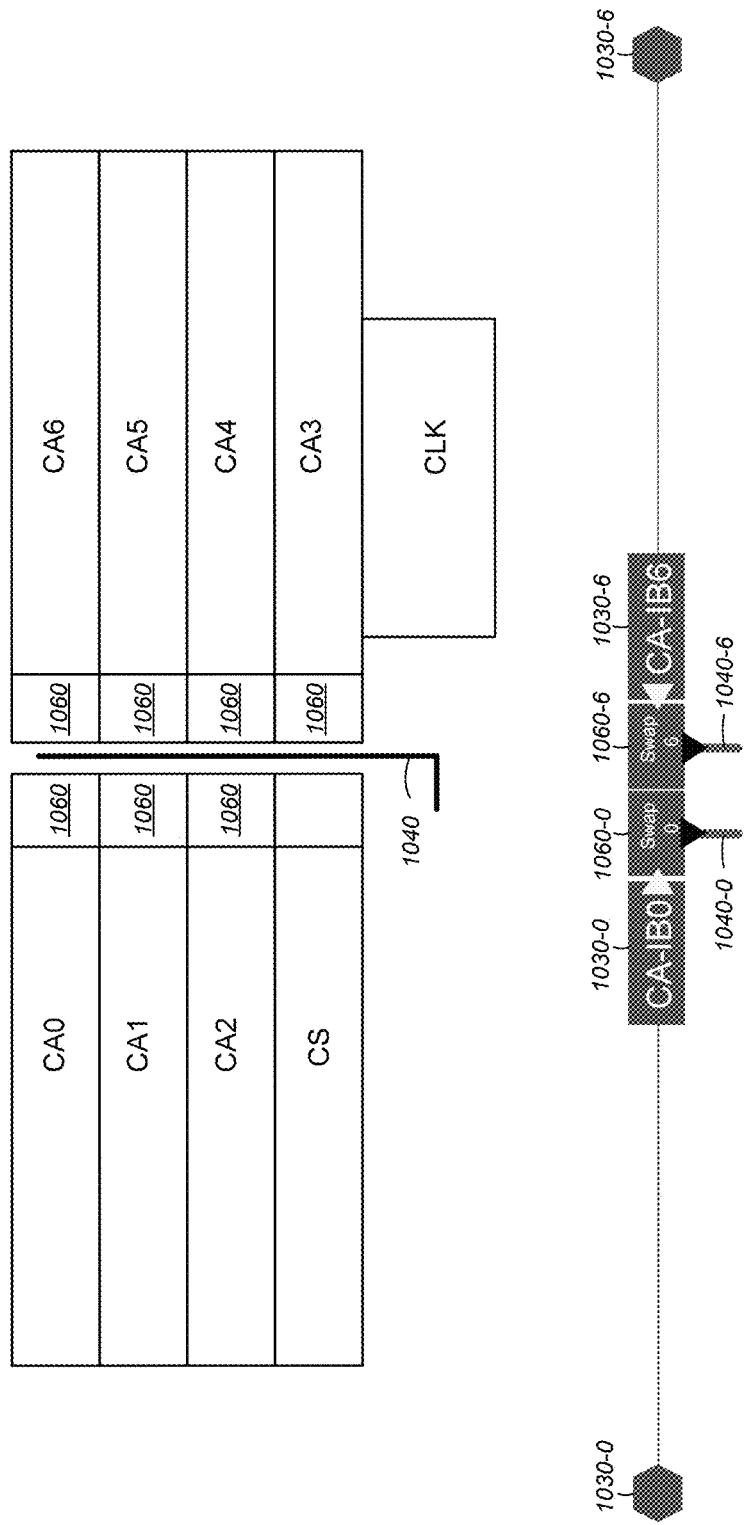
FIG. 10 is a layout diagram showing details of the CA interface region and swapped CA signals.

FIG. 10 is a layout diagram showing details of the CA interface region and swapped CA signals. In FIG. 10 the swap circuits 1060 are positioned in a center location between the CA input circuits. The bottom portion of FIG. 10 illustrates a schematic representation to show that relatively long wiring is between the bonding pads (1030-0 and 1030-6) and the CA input circuits (1030-0 and 1030-6). However, the CA input circuits (1030-0 and 1030-6) and the swap circuits (1060-0 and 1060-6) are very closely positioned. The swap circuits (1060-0 and 1060-6) generate the internal CA signals (1040-0 and 1040-6) with selection to the appropriate bonding pad based on the state of the control signal.

Conventional memory devices including swap circuits may have the swap circuits positioned closer to the input buffers, which are generally position close to their associated bonding pads. In the embodiment of the present disclosure shown in FIG. 10, because the distance from CA input circuits can be made as short as possible, the overall routing capacitance is significantly reduced and, as a result, the power consumption is reduced.

The swap circuits are generally shown to be positioned next to the latch circuit and coupled to the output of the latch circuit. This configuration and positioning may create the smallest routing and layout footprint. However, embodiments of the present disclosure are not so limited. The control signal is generally static and does not change during operation of the memory device. As a result, and referring to FIGS. 4 and 10, the swap circuit 1060 may be placed anywhere in the chain of circuits for the CA input circuit 430. For example, the swap circuit could be placed between the input buffer circuit 432 and the delay circuit 434, between the delay circuit 434 and the latch circuit 436 or after the latch circuit 436. Moreover, this placement may be functional and/or positional. In other words, even if the swap circuit 1060 is placed in the center most position, it could still be functionally coupled to the input of the delay circuit 434 rather than the output of the latch circuit 436.

In general, the swap circuits 1060 have been explained as a swap circuit associated with each CA input circuit 1030. However, since the swap circuits 1060 are only needed in pairs of CA input circuits 1030, the swap circuit 1060 may be configured from logic and layout points of view as a single element couple to each of the CA input circuits 1030 in the pair.

Figure 11:
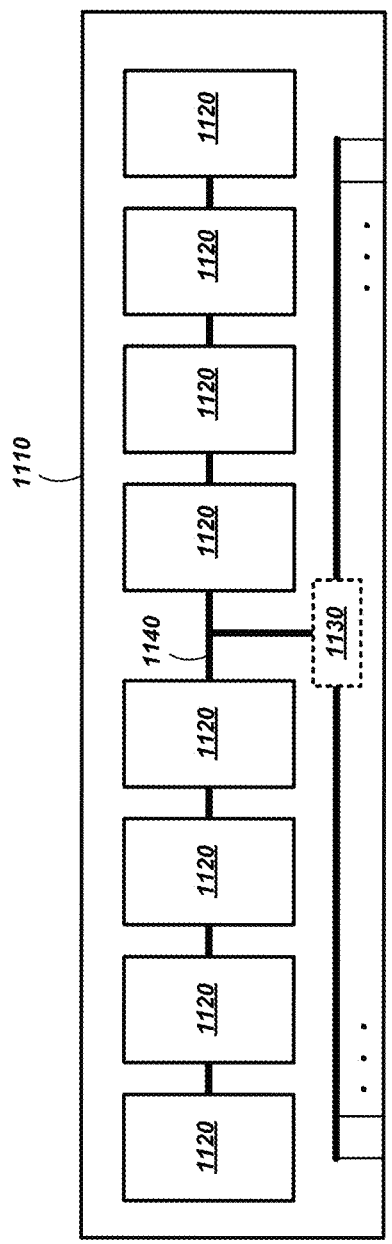
FIG. 11 is a simplified block diagram of a memory module implemented according to one or more embodiments described herein.

FIG. 11 is a simplified block diagram of a memory module implemented according to one or more embodiments described herein. The memory module 1110 may be configured as a memory system and may include a memory controller 1130 and two or more memory devices 1120 with routing 1140 between the memory devices 1120 and the memory module input/output signals and/or the memory controller 1130. Moreover, the stacked memory device configuration of FIG. 7 is also considered a memory module and a memory system.

Figure 12:
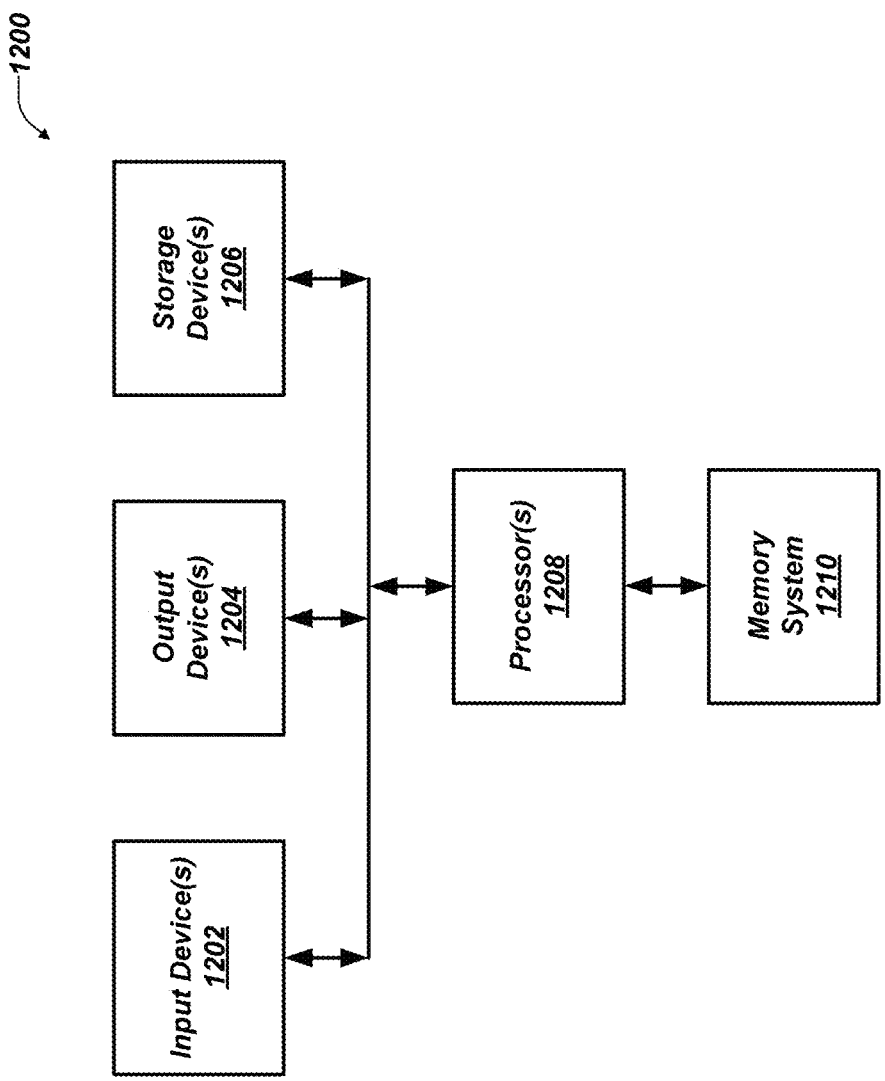
FIG. 12 is a simplified block diagram of a system implemented according to one or more embodiments described herein.

FIG. 12 is a simplified block diagram of a system 1200 implemented according to one or more embodiments described herein. The system 1200 may include at least one input device 1202. Non-limiting examples of input devices 1202 include sensors, a keyboard, a mouse, a touch screen, or other user interface type inputs. Electronic system 1200 further includes at least one output device 1204. Output device 1204 may be a monitor, touch screen, or speaker. Input device 1202 and output device 1204 are not necessarily separable from one another. Electronic system 1200 further includes a storage device 1206. Input device 1202, output device 1204, and storage device 1206 are coupled to a processor 1208. Electronic system 1200 further includes a memory system 1210 coupled to processor 1208. Memory system 1210 includes at least one memory cell (e.g., an array of memory cells), wherein one or more memory cells of memory system 1210 may include a transistor. Further, in some embodiments, one or more memory cells may include and/or may be associated with (e.g., coupled to) one or more measurement circuits according to one or more embodiments described herein. Electronic system 1200 may include a computing, processing, industrial, or consumer product. For example, without limitation, electronic system 1200 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

CONCLUSION

Embodiments of the present disclosure include a memory device including a bonding pad region with two or more bonding pads for operably coupling to external signals and two or more CA input signals. The memory device also includes a memory cell region for storing information in a plurality of memory cells and a centralized (CA) interface region. The centralized CA interface region includes two or more CA input circuits operably coupled to the two or more CA input signals and the centralized CA interface region is positioned between the bonding pad region and the memory cell region in a layout arrangement with the two or more CA input circuits neighboring each other in a compact region such that clock routing to the two or more CA input circuits is substantially reduced.

Embodiments of the present disclosure also include a memory system with a plurality of memory devices. Each memory device of the plurality includes a memory cell region for storing information in a plurality of memory cells and a centralized CA interface region including two or more CA input circuits operably coupled to two or more CA input signals. Each of the two or more CA input signals are from an associated two or more bonding pads. The centralized CA interface region comprises a layout arrangement positioned between the two or more bonding pads and the memory cell region with the two or more CA input circuits neighboring each other in a compact region such that clock routing to the two or more CA input circuits is substantially reduced.

Still other embodiments of the present disclosure include a system including one or more processors, a memory controller operably coupled to the one or more processors, and one or more memory devices operably coupled to the memory controller. Each memory device of the one or more memory devices includes a bonding pad region including two or more bonding pads for operably coupling to external signals and two or more CA input signals and a memory cell region for storing information in a plurality of memory cells. Each memory device also includes a centralized CA interface region including two or more CA input circuits operably coupled to the two or more CA input signals, wherein the centralized CA interface region is positioned between the bonding pad region and the memory cell region in a layout arrangement with the two or more CA input circuits abutting each other.

Terms used herein and especially in the appended claims are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
    a command and address (CA) interface including:
        a first pair of input circuits arranged in a first direction and for receiving a first pair of CA input signals via a first pair of signal lines; and
        at least one additional pair of input circuits arranged in a second direction relative to the first pair of input circuits and for receiving at least one additional pair of CA input signals via at least one additional pair of signal lines, wherein each signal line of the first pair of signal lines and the additional pair of signal lines has a substantially equal length from an associated bonding pad to an associated input circuit of either the first pair of input circuits or the at least one additional pair of input circuits.

2. The device of claim 1, further comprising a bonding pad region and a memory cell region, wherein the CA interface is positioned between the bonding pad region and the memory cell region.

3. The device of claim 1, wherein the first pair of input circuits are arranged in a mirror relationship in the first direction.

4. The device of claim 1, wherein each input circuit of the first pair of input circuits comprises:
    a buffer circuit operably coupled to one of a number of input signals;
    a latch circuit for receiving one or more clock signals; and
    a delay circuit arranged between the buffer circuit and the latch circuit.

5. The device of claim 1, wherein the at least one additional pair of input circuits comprises a plurality of pairs of input circuits stacked in the second direction.

6. The device of claim 1, wherein a first input circuit and a second input circuit of the first pair of input circuits are arranged in a mirror relationship in the first direction, and wherein a third input circuit and a fourth input circuit of the at least one additional pair of input circuits are arranged in a mirror relationship in the first direction.

7. The device of claim 1, wherein the CA interface is positioned between a bonding pad region and a memory cell region in a layout arrangement with the first pair of input circuits and the at least one additional pair of input circuits neighboring each other in a compact region.

8. The device of claim 1, wherein the at least one additional pair of input circuits includes a second pair of input circuits and a third pair of input circuits, wherein the CA interface is configured such that the second pair of input circuits are adjacently arranged in a mirror relationship in the first direction and the third pair of input circuits adjacently arranged in a mirror relationship in the first direction.

9. The device of claim 8, wherein the second pair of input circuits is arranged adjacent to the first pair of input circuits in the second direction, and the third pair of input circuits is arranged adjacent to the second pair of input circuits in the second direction.

10. A system, comprising:
a number of memory devices, each memory device of the number of memory devices comprising a command and address (CA) interface including:
  a first pair of input circuits adjacently arranged in a mirror relationship in a first direction and for receiving a first pair of input signals via a first pair of conductors; and
  a second pair of input circuits adjacently arranged in a mirror relationship and arranged in a second direction relative to the first pair of input circuits and for receiving a second pair of input signals via a second pair of conductors, each of the first pair of input circuits and the second pair of input circuits for receiving CA input signals including at least one of address information or command information;
  wherein each conductor of the first pair of conductors and the second pair of conductors has a substantially equal length from an associated bonding pad to an associated input circuit of either the first pair of input circuits or the second pair of input circuits.

11. The system of claim 10, the CA interface further comprising a third pair of input circuits adjacently arranged in a mirror relationship and arranged in the second direction relative to the first pair of input circuits.

12. The system of claim 10, wherein at least one input circuit of at least one of the first pair of input circuits or the second pair of input circuits comprise:
  a buffer circuit arranged outwards from a center of the mirror relationship; and
  latch circuit arranged towards the center of the mirror relationship and configured for receiving one or more clock signals with compact routing.

13. The system of claim 10, further comprising a clock buffer circuit adjacent to at least one input circuit of either the first pair of input circuits or the second pair of input circuits, the clock buffer circuit configured to supply one or more clock signals to each clock circuit of the first pair of input circuits or the second pair of input circuits.

14. The system of claim 10, the CA interface further comprising a third pair of input circuits including one input circuit for receiving a chip select signal.

15. A system, comprising:
a controller; and
a memory device operably coupled to the controller and comprising a command and address (CA) interface region including:
  a first pair of input circuits arranged in a first direction, each input circuit of the first pair of input circuits for receiving an associated input signal via an associated signal line of a number of signal lines; and
  at least one additional pair of input circuits arranged in a second direction relative to the first pair of input circuits, each input circuit of the at least one additional pair of input circuits for receiving an associated input signal via an associated signal line of the number of signal lines, wherein each signal line of the number of signal lines has a substantially equal length from an associated bonding pad to its associated input circuit.

16. The system of claim 15, wherein the first pair of input circuits comprises a first input circuit and a second input circuit, the first input circuit and the second input circuit arranged in a mirror relationship in the first direction.

17. The system of claim 16, wherein the at least one additional pair of input circuits comprises a third input circuit and a fourth input circuit, the third input circuit and the fourth input circuit arranged in a mirror relationship in the first direction.

18. The system of claim 15, wherein each of two input circuits of the first pair of input circuits comprises:
  a buffer circuit for coupling to an associated input signal;
  a delay circuit operably coupled to an output of the buffer circuit; and
  a latch circuit operably coupled to an output of the delay circuit and configured for receiving one or more clock signals for latching a signal level of the associated input signal.

19. The system of claim 18, wherein the two input circuits are positioned in adjacently arranged pairs in a mirror relationship with the latch circuit positioned innermost in the mirror relationship, the buffer circuit positioned outermost in the mirror relationship, and the delay circuit positioned between the buffer circuit and the latch circuit.

20. The system of claim 15, wherein a first input circuit of the first pair of input circuits is adjacent to a second input circuit of the at least one additional pair of input circuits.

* * * * *